(12) United States Patent
Pagani (10) Patent No.: US 9,224,694 B2
(45) Date of Patent: Dec. 29, 2015

(54) TRACEABLE INTEGRATED CIRCUITS AND PRODUCTION METHOD THEREOF

(75) Inventor: Alberto Pagani, Nova Milanese (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 510 days.

(21) Appl. No.: 13/194,197

(22) Filed: Jul. 29, 2011

(65) Prior Publication Data

US 2012/0025344 A1 Feb. 2, 2012

(30) Foreign Application Priority Data

Jul. 29, 2010 (IT) .............................. MI2010A1415

(51) Int. Cl.
*H01L 23/544* (2006.01)
*H01L 23/00* (2006.01)
*H01L 23/58* (2006.01)

(52) U.S. Cl.
CPC ............ *H01L 23/544* (2013.01); *H01L 23/562* (2013.01); *H01L 23/585* (2013.01); *H01L 2223/5448* (2013.01); *H01L 2223/54406* (2013.01); *H01L 2223/54413* (2013.01); *H01L 2223/54433* (2013.01); *H01L 2223/54473* (2013.01); *H01L 2924/0002* (2013.01)

(58) Field of Classification Search
CPC ... H01L 23/544; H01L 23/562; H01L 23/585; H01L 2223/544; H01L 2223/54406; H01L 2223/54413; H01L 2223/54433; H01L 2223/54473; H01L 2223/54493; H01L 2924/0002; H01L 21/67294; H01L 22/34

USPC .......... 257/618, 619, 620, 622, 797, E23.001, 257/E23.002, E23.179, E21.237, E21.238; 438/401, 462

See application file for complete search history.

(56) References Cited

U.S. PATENT DOCUMENTS

| 3,562,536 | A | | 2/1971 | Brunner |
| 4,779,981 | A | | 10/1988 | Ukaji |
| 4,794,238 | A | * | 12/1988 | Hampton ................. 235/462.32 |
| 5,175,774 | A | * | 12/1992 | Truax et al. ................... 382/145 |
| 5,696,031 | A | * | 12/1997 | Wark ................................ 438/4 |
| 6,063,685 | A | | 5/2000 | Steffan et al. |
| 7,202,550 | B2 | * | 4/2007 | Fu et al. ......................... 257/620 |
| 7,434,021 | B2 | * | 10/2008 | Chauvel et al. ................ 711/170 |

(Continued)

FOREIGN PATENT DOCUMENTS

| JP | 10-012527 | * | 1/1998 | ............ H01L 21/027 |
| JP | 10012527 | | 1/1998 | |

(Continued)

OTHER PUBLICATIONS

Search Report for Italian Patent Application No. MI20101415, Ministero dello Sviluppo Economico, Munich, Apr. 1, 2011, pp. 2.

*Primary Examiner* — Galina Yushina (74) *Attorney, Agent, or Firm* — Gardere Wynne Sewell LLP (57) ABSTRACT

An embodiment of a method for producing traceable integrated circuits includes forming on a wafer of semiconductor material functional regions for implementing specific functionalities of corresponding integrated circuits, forming at least one seal ring around each functional region of the corresponding integrated circuit, and forming on each integrated circuit at least one marker indicative of information of the integrated circuit. Forming on each integrated circuit at least one marker may include forming the at least one marker on at least a portion of the respective seal ring that is visible.

17 Claims, 8 Drawing Sheets

(56) References Cited

U.S. PATENT DOCUMENTS

| | | |
|---|---|---|
| 2002/0090793 A1* | 7/2002 | Kawano ........................ 438/401 |
| 2003/0047806 A1 | 3/2003 | Stelzl et al. |
| 2005/0104176 A1* | 5/2005 | Rodney et al. ................ 257/678 |
| 2005/0263855 A1 | 12/2005 | Fu et al. |
| 2006/0022224 A1* | 2/2006 | Hiroi ............................. 257/226 |
| 2007/0029641 A1 | 2/2007 | Hamatani et al. |
| 2008/0233737 A1* | 9/2008 | Liu ............................... 438/637 |
| 2009/0115024 A1 | 5/2009 | Jeng et al. |
| 2011/0180922 A1* | 7/2011 | Chen et al. .................... 257/700 |

FOREIGN PATENT DOCUMENTS

| | | | | |
|---|---|---|---|---|
| JP | 2000-156434 | * | 6/2000 | ............. H01L 23/28 |
| TW | I264755 | | 10/2006 | |

* cited by examiner

TRACEABLE INTEGRATED CIRCUITS AND PRODUCTION METHOD THEREOF

PRIORITY CLAIM

The instant application claims priority to Italian Patent Application No. MI2010A001415, filed Jul. 29, 2010, which application is incorporated herein by reference in its entirety.

TECHNICAL FIELD

An embodiment generally relates to integrated circuits; in particular, an embodiment relates to integrated circuits provided with markings for traceability thereof downstream of their production processes.

BACKGROUND

Typically, each integrated circuit or chip (e.g., an integrated electronic circuit) includes a substrate of semiconductor material on which a functional region is integrated (typically, functional components and metal layers for the corresponding electrical connections) for implementing specific functionalities of the chip. The chips are formed in large number within a wafer of semiconductor material through a production process typically executed in a sequence of stages, after which the wafer includes a plurality of identical chips. Each chip also includes a respective perimeter protection ring (seal ring), which has the purpose of both mechanically strengthening the chip (especially, in order to avoid subsidence of the same during the cutting operation of the wafer for separating the various chips formed thereon) and minimizing risks of contamination and inclusion of foreign bodies within the functional region of the chip. Adjacent chips within the wafers are spaced apart from each other by separation regions called scribe lines, which typically act as cutting lines along which the chips are separated from each other by cutting operations (through a suitable saw or laser); once the chips have been separated, they are encapsulated in respective packages.

In case that the integrated circuits are found to be defective before or during their use, they are returned to the manufacturer in order to perform failure analysis; therefore, the possibility of tracing the original position of the chip within the corresponding wafer (or other significant parameters) is of strategic importance for the management of quality of the production process. In fact, performance and reliability of each chip may also vary considerably depending on its position within the corresponding wafer (or other parameters relating or having reference to the production process). For this reason, it may be important for the manufacturer to know at which level of the production process to act for improving the quality thereof.

To such purpose, in the production process of integrated circuits there are also provided marking operations of the same so as to keep track of the positions (and/or of other identification parameters) of the corresponding chips within the wafer also downstream of the corresponding production process. To this purpose, in the state of the art it is possible to identify substantially two different approaches for performing said markings and obtaining traceable chips.

In particular, a first approach provides for electrically writing significant information within suitable dedicated memory circuits (e.g., non-volatile memories) formed within each chip; however, the solutions using such approach may be affected by a relatively large waste in terms of area occupation of the chip (having to integrate also such memory circuits within the corresponding functional region), with resulting increase of the production costs of the integrated circuit. Moreover, such solutions may not be applicable to chips having a fully analogical functional region, both because of problems of compatibility of interface between the latter and the (digital) memory circuits, and because of the need of specific technological processes to make such memory circuits. Moreover, the information reading, being indirect (but requiring proper reading circuits), may be difficult and slow.

Another approach provides for making a physical marking on each chip that may be read directly and from which information about the chip may be quickly deduced.

For example, in U.S. Pat. No. 3,562,536, which is incorporated by reference, such marking includes bar codes made within the scribe lines and obtained by etching processes; however, the cutting operation along the scribe lines may damage such bar codes, thus making the information encoded by them inaccessible; moreover, typically it may be preferred to allocate the entire surface of the scribe lines to functional structures (called TEG, or Test Element Group) through which it is possible to perform parametric measurements of the production process.

Alternatively, typically the marking may be executed by forming (numeric or alphanumeric) codes or maps during the production process of the chips through proper photolithographic masks; however, such solution is may not be applicable for the current production processes. In fact, with the increase of the size of the wafers and with the increase of the capacity of integration of the integrated circuits, each step of the production process of the chips (through the corresponding photolithographic mask) may not be carried out by a single step over the entire surface of the wafer, but is typically carried out step by step on different portions of the wafer; at each step the mask acts on a corresponding area of the wafer in which, at the end of the process, a corresponding group of chips will be made (with each chip of the group having its own marking); the same operation is repeated to apply the same mask on the entire surface of the wafer. In this way, chips of different groups in the same relative position will have the same marking; as a consequence, auxiliary markings will be needed for distinguishing the different groups of chips in the wafer from each other. Moreover, such solution makes the marking within the region of the chip bounded by the respective seal ring, i.e., wherein the corresponding functional components are integrated; this may imply a significant increase of the overall area occupation of the chip, especially if the markings include codes (or maps) being long and complex and/or requiring auxiliary markings.

Another solution, disclosed in U.S. Pat. No. 6,063,685, which is incorporated by reference, provides for making the marking in regions not used (for electrical connections) of a last metal layer of the functional region of the respective chip through laser-writing techniques and equipment; however, such marking, being made within inner regions of the seal ring, does not exclude the possibility that the corresponding functional region is accidentally damaged during writing, with resulting loss of production yield of the chips; moreover, in case that the availability of such inner regions of the seal ring is not ensured for marking, this could represent a further design parameter, with consequent possible cost increases.

SUMMARY

An embodiment overcomes the above-cited drawbacks.

More specifically, an embodiment is a method for producing traceable integrated circuits. The method includes forming on a wafer of semiconductor material functional regions for implementing specific functionalities of corresponding integrated circuits, forming at least one seal ring around each functional region of the corresponding integrated circuit, and forming on each integrated circuit at least one marker indicative of information of the integrated circuit. In an embodiment, the step of forming on each integrated circuit at least one marker includes forming the at least one marker on at least one portion of the respective seal ring visible external to the integrated circuit.

Another embodiment is a corresponding integrated circuit.

Thanks to an embodiment, it may be possible to obtain traceable integrated circuits easily and effectively, without their production yield being compromised; in fact, making the marking on the seal ring may allow avoiding risks of damaging the functional regions during the writing of the markings. Moreover, since an embodiment of a marking method is not made through photolithographic techniques, it may be equally valid for integrated circuits having particularly reduced size; for the same reason, no complex or additional markings and/or mappings are required that could cause a relevant overall increase in terms of area occupation of the integrated circuit.

BRIEF DESCRIPTION OF THE DRAWINGS

Features and advantages will be best understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In this respect, it is expressly understood that the figures are not necessarily drawn to scale (with some details that may be exaggerated and/or simplified) and that, unless otherwise indicated, they are simply used to conceptually illustrate the described structures and procedures according to one or more embodiments. In particular.

DETAILED DESCRIPTION

Figure 1:
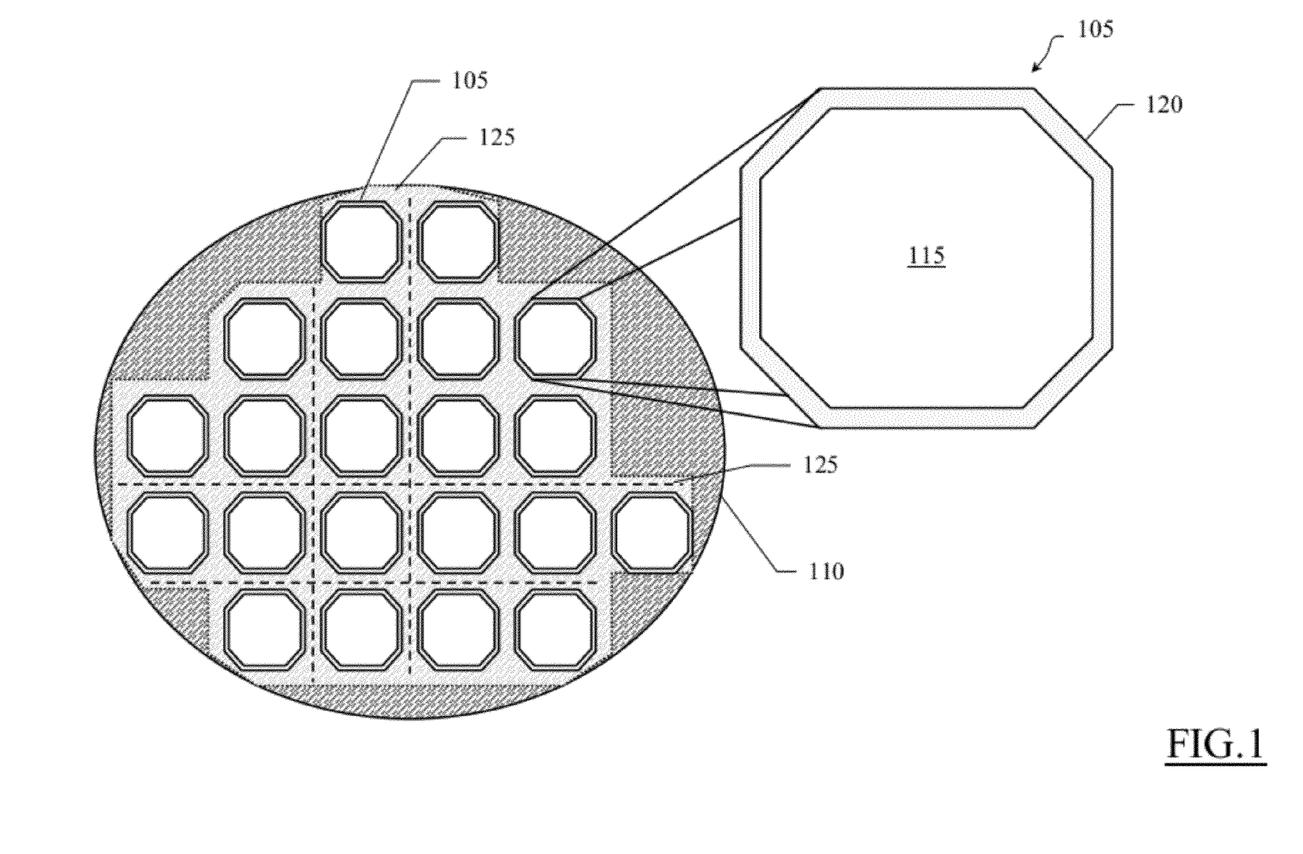
FIG. 1 schematically shows in top view the structure obtained at an intermediate step of a production process of integrated circuits wherein an embodiment may be applied.

Considering in particular FIG. 1, it schematically shows in top view the structure obtained at an intermediate step of a production process of conventional integrated circuits or chips.

In particular, the integrated circuits 105 are made on a wafer 110 of semiconductor material. As best visible in the detail of FIG. 1, each chip 105 includes a functional region 115, wherein electronic components (and metal layers or other materials for their electrical connections) are integrated that implement specific functionalities of the integrated circuit; the functional region 115 of each chip 105 is surrounded by a respective seal ring 120, which generally accomplishes protection functions against mechanical damages and chemical contaminations of the functional region 115 of the respective chip 105. Adjacent chips 105, or adjacent seal rings 120, are spaced apart from each other to form separation regions, or scribe lines 125 of the (and on the) wafer 110 (represented in the figure with a different shading with respect to the latter for simplicity), which scribe lines 125 (only four shown in the figure for simplicity, and represented by dashed lines) will be used for subsequent cutting operations of the wafer 110 (through a suitable saw or laser, not shown) thereby obtaining the division between the different chips 105, which then may be encapsulated in corresponding packages (not shown).

In relatively recent applications, such as that an exemplary but not limiting described embodiment, the scribe lines 125 are usually filled with elementary structures TEG (not shown) for the measurement of significant parameters of the manufacturing process, and hence typically the scribe lines 125 are not available for other uses.

It should be noted that the seal ring 120 in an exemplary disclosed embodiment has a chamfered profile at the four corners of the respective chip 105 so as to better preserve its integrity during the cutting operation; in fact, each corner of the chip 105, being subjected both to a longitudinal stress and to a transversal stress of the saw during the cutting operation, is a region significantly exposed to possible causes of mechanical failures. Anyway, various shapes and configurations of the seal ring 120 are known, which are usable indiscriminately in an embodiment without that the protection scope of the same is amended; for this reason, the chamfered profile for the seal ring 120 is not to be construed in a limiting way.

Beginning from the basic structure of the known chip 105, it may be possible to perform different markings of the same, so as to obtain different chips according to corresponding embodiments; in the following, for reference simplicity, similar and/or corresponding elements of different embodiments will be denoted by similar references but differentiated only by the first digit.

Figure 2A:
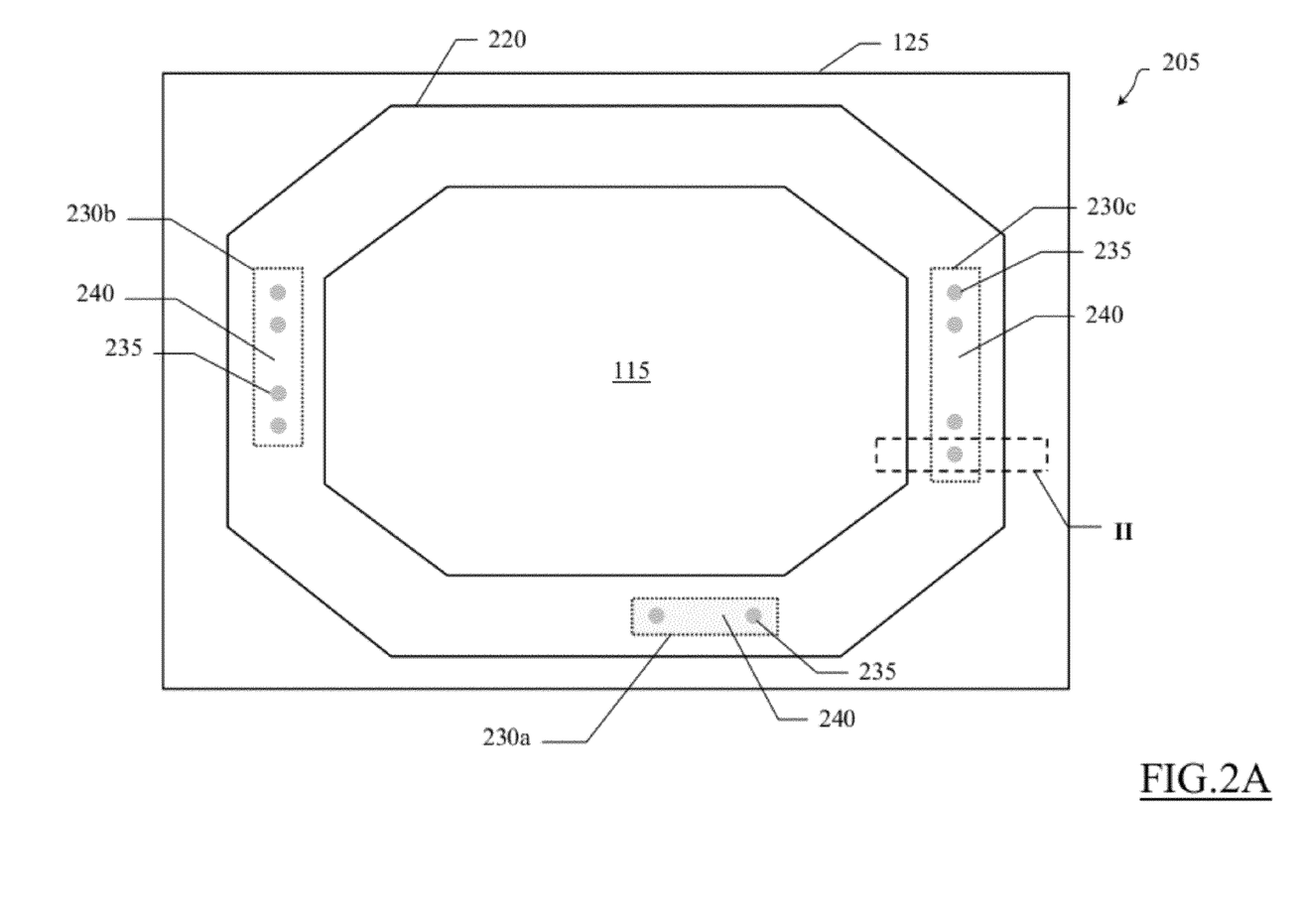
FIG. 2A schematically shows in top view a generic chip of the structure of FIG. 1 according to an embodiment.

In FIG. 2A there is shown in top view a generic chip 205 according to an embodiment. The seal ring 220 includes, unlike the seal ring 120 of the conventional implementation, one or more markers, only three shown in an exemplary embodiment illustrated in the figure and denoted by references 230a, 230b, 230c, respectively; in particular, such markers are made on portions of the seal ring 220 that are visible (since not covered by elements of the chip) from outside of the integrated circuit also downstream of the production process. In this regard it is noted that the position of the markers 230a, 230b, 230c within the seal ring 220 is not to be understood in a limitative way, but only exemplarily; in particular, depending on particular and specific requirements, such markers 230a, 230b, 230c may be properly arranged along all the visible surface of the seal ring 220, which may be predefined at the design stage—for example, by properly arranging such markers in areas having relatively low density of connection wires, or wire bond, created during the embedding process of each chip within the corresponding package. For example, in an alternative embodiment, not shown, one or more of such markers may be positioned along the chamfers of the seal ring 220, or more generally along corner regions thereof.

In an embodiment, each marker 230a, 230b, 230c is made in such a way that it may be read directly (i.e., visually) and easily interpreted as an appropriate binary code, i.e. a sequence or string of binary digits (e.g., with values 0 and/or 1); such binary code may be used for encoding information of the chip 205 that are considered significant, such as, for example, the position of the chip 205 in the wafer (e.g., through the use of a coordinate system), lot number of the wafer, wafer position in the lot, manufacturing plant of the wafer, and/or masks set used for the making of the chip 205. In particular, each marker 230a, 230b, 230c includes (depending on the value of the binary code to be implemented) a plurality of dots 235 (schematically represented in the figure as grey circles) to each of which is associated, for example, the digit 1, and a plurality of missing dots 240 (represented in the figure as an empty position since not occupied by a dot) to each of which is associated, for example, the digit 0. In the examples in the figure, the marker 230a, including a dot 235, followed by two missing dots 240 and by another dot 235, is read as binary code of value 1001; instead, the marker 230b, including two dots 235 followed by a missing dot 240 and by two other dots 235, is read as binary code of value 11011; finally, the marker 230c, including two dots 235 followed by two missing dots 240 and by two other dots 235, is read as binary code of value 110011. In this regard, it is noted that, in order that the reading of the binary code is made correctly, there may be a fixed distance between adjacent 235 dots; as a consequence, a missing dot 240 may be interpreted as such in the presence of an empty region of the seal ring (i.e., not occupied by any dot 235) of extent substantially equal to, for example, twice the fixed distance that there is between two adjacent dots 235.

At least one reference element (for example, one or more further dots, not shown for simplicity) may be formed for allowing a correct reading of the binary code, for example for indicating a reading starting point and/or a reading direction (and/or other similar indications).

Figure 2B:
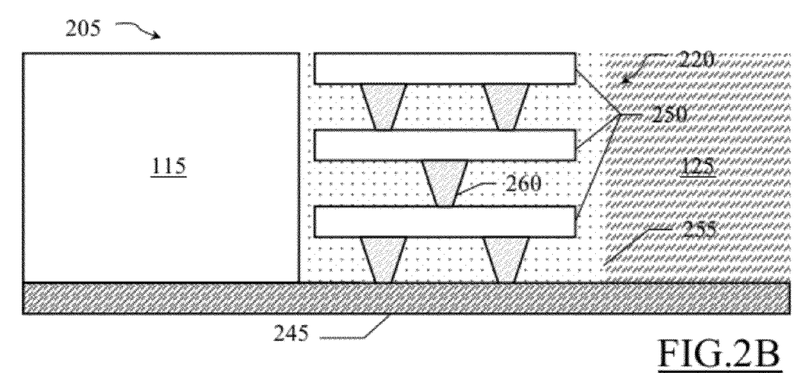
FIGS. 2B-2D schematically show in front view some steps of the production process of the chip of FIG. 2A according to an embodiment.
Figure 2C:
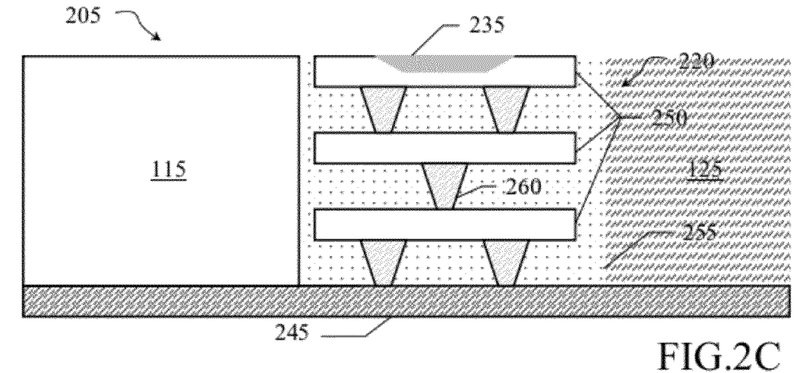
Figure 2D:
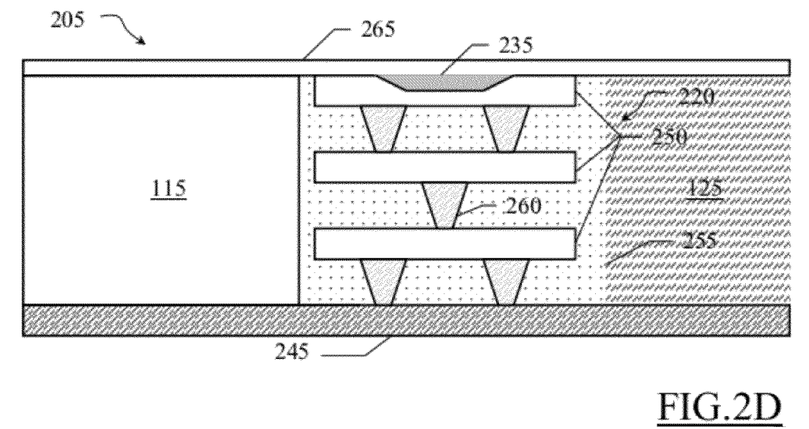

Turning to FIGS. 2B-2D, they schematically show in front view some exemplary steps of an embodiment of a production process of the chip 205 (of which only the portion bounded by II in FIG. 2A is shown in section for simplicity); with particular reference to FIG. 2B, the chip 205 is yet at an advanced stage of its production process. In particular, the chip 205 includes a substrate 245, i.e., a predefined portion of the wafer 105 on which there are integrated, in a known manner, the functional region 115 (shown in the figure as a generic block) comprising electronic components and metal layers for the corresponding electrical connections, and the corresponding seal ring 220 surrounding the functional region 115 to protect it.

In general, since typically the formation process of the seal ring 220 is parallel to the formation process of the functional region 115, such processes are usually carried out by exploiting the same (or similar) manufacturing techniques; for this reason, in the exemplary described embodiment, the seal ring 220 includes a stacked structure of metal layers and vertical connections (vias, in jargon) similar to that provided (but not shown) in the functional region 115. In particular, without entering into excessive detail, per sé well known, the seal ring 220 includes a plurality of metal layers 250, for example copper, stacked on each other from the substrate 245; each metal layer 250 is mechanically separated from the underlying metal layer 250 (or from the substrate 245, in the case of the first metal layer 250) by a suitable dielectric layer 255 and electrically connected thereto by the corresponding vias 260 obtained within the dielectric layer 255; in other words, as it is known, the dielectric layer 255 and the vias 260 between adjacent metal layers 250 act as corresponding spacer elements. As shown in FIG. 2C, the last conductive layer 250 of the seal ring 220 is subjected to a writing technique through laser incision (through a suitable laser apparatus, not shown since per sé known and, however, not limiting) for making the desired marking (in the considered example, the dot 235 of the marker 230c). In particular, grooves are formed on portions of the last metal layer 250 subjected to the laser action, each one of which grooves is associable with a corresponding dot 235, whereas portions not subjected to the laser action are associated with respective missing dots 240 (not visible in the figure due to the illustrated portion of the chip 205 and to the considered point of view).

In order to facilitate the writing operation and obtain dots 235 that are as homogeneous as possible to each other, before the writing a finishing process of the exposed surface of the chip 205 (and in particular of the last metal layer 250 of the seal ring 220) may be performed; such finishing process may be performed by, for example, a known Chemical-Mechanical Polishing (or CMP) technique, which allows making the exposed surface of the chip 205 planar, with a very low unevenness and an excellent selectivity.

Subsequently, as shown in FIG. 2D, a passivation layer 265 is deposited on the structure thereby obtained, which passivation layer allows protecting the chip 205 by preserving it from contamination/corrosion by atmospheric agents or by unwanted chemical reactions. Furthermore, the passivation layer 265, by depositing also inside the grooves that identify the dots 235 (possibly) provided on the seal ring 220, preserves and protects also the markers, thereby preventing alterations thereof (e.g., corrosions) that might distort the reading of the respective codes encoded by them.

It is noted that, before depositing the passivation layer 265, it may be useful to perform a cleaning process of the surface of the wafer in order to remove possible contaminating particles deposited and/or formed thereon.

Figure 3A:
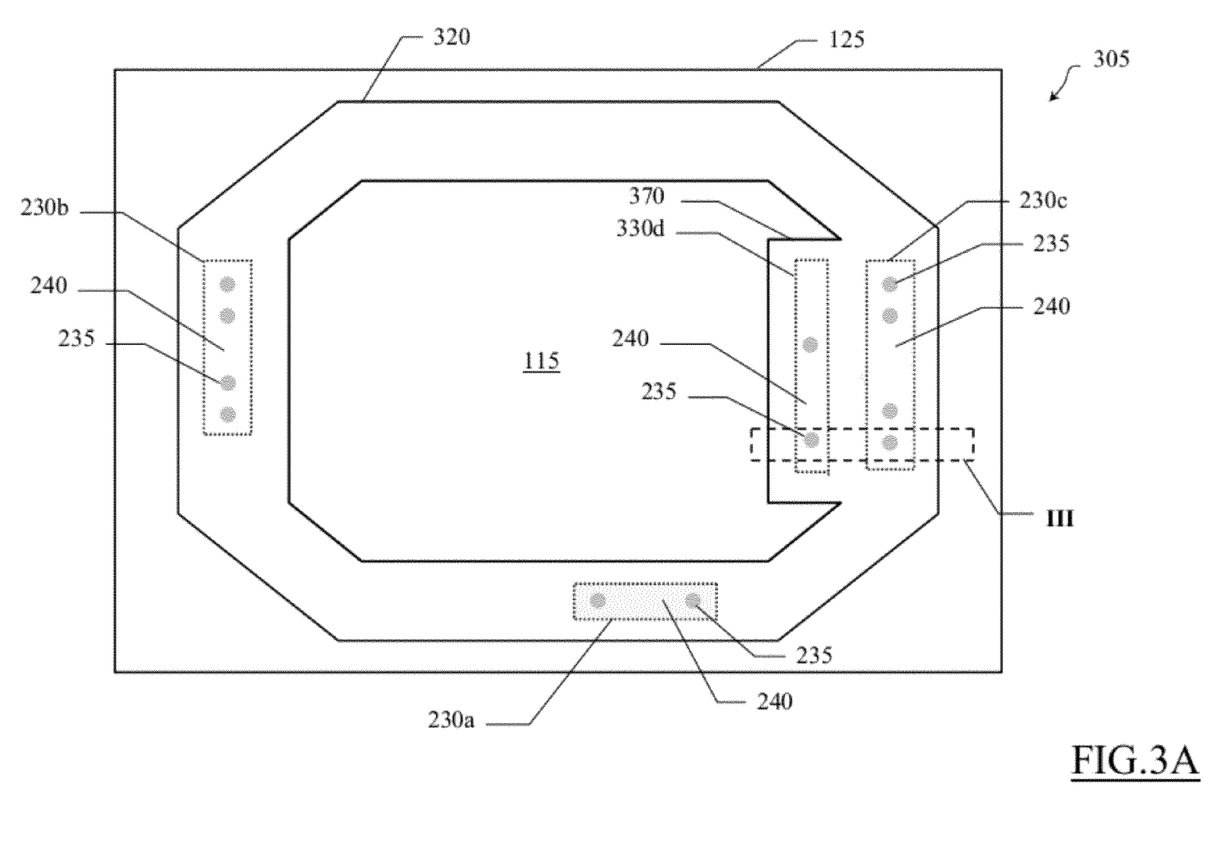
FIG. 3A shows in top view a generic chip of the structure of FIG. 1 according to another embodiment.

Turning now to FIG. 3A, it shows a top view of a generic chip 305 according to another embodiment. The chip 305 is substantially similar to the chip 205, but, unlike the latter, it has a seal ring 320 including an additional portion 370 extending in an area of the functional region 115 at relatively low density of occupation of components and/or electrical connections; in this respect, it is considered that typically, during the layout design of the chips, it is necessary to comply with design rules, so that areas of the functional region 115 (typically, but not necessarily, the peripheral ones) may have a relatively low occupation. In the exemplary but not limitative described embodiment, the seal ring 320 still includes markers 230a, 230b, 230c, and a further marker 330d made (in a way that will be described shortly) in such additional portion of the seal ring 320.

The marker 330d of the chip 305 thereby obtained may usefully be employed to achieve a two-dimensional encoding system, unlike the encoding used for the markers 230a, 230b and 230c (and identifiable as one-dimensional, since it includes an ordered string of dots 235 and missing dots 240 to be read along a single direction). Such two-dimensional encoding is obtained, in the example at issue, by combining information of the marker 330d and those of the marker 230c (or, possibly, those of the markers 230a and 230b). For example, the marker 330d may be used for implementing code redundancies (so as to not lose information also in case of damages of markers in sensitive positions of the seal ring 320), establishing a reading reference of the markers (e.g., a direction and/or reading start point thereof), or encoding an index according to a matrix mapping.

However, it is noted that the information contained in the markers 230a, 230b and 230c may be properly encoded using codes that may implement redundancy and/or codes that allow, for example, error correction to meet specific requirements.

Figure 3B:
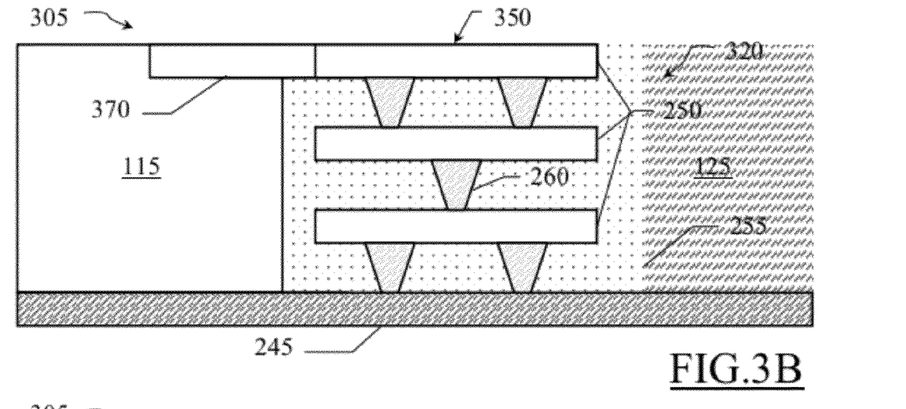
FIGS. 3B-3D show some steps of a production process of the chip of FIG. 3A according to an embodiment.
Figure 3C:
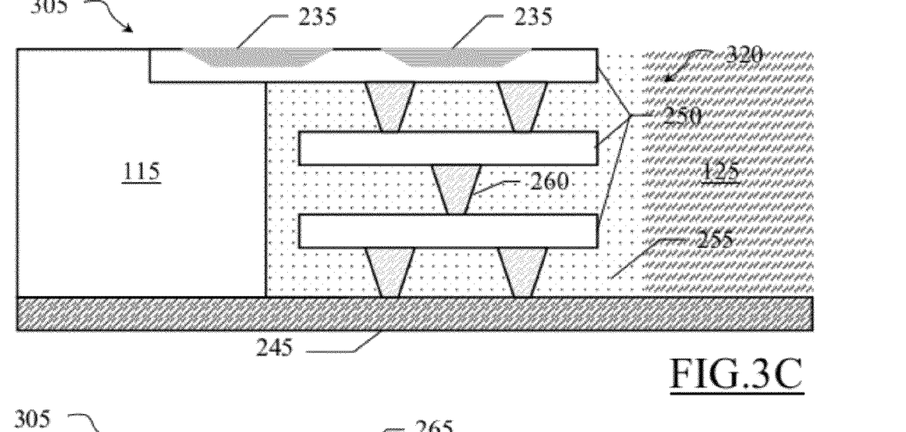
Figure 3D:
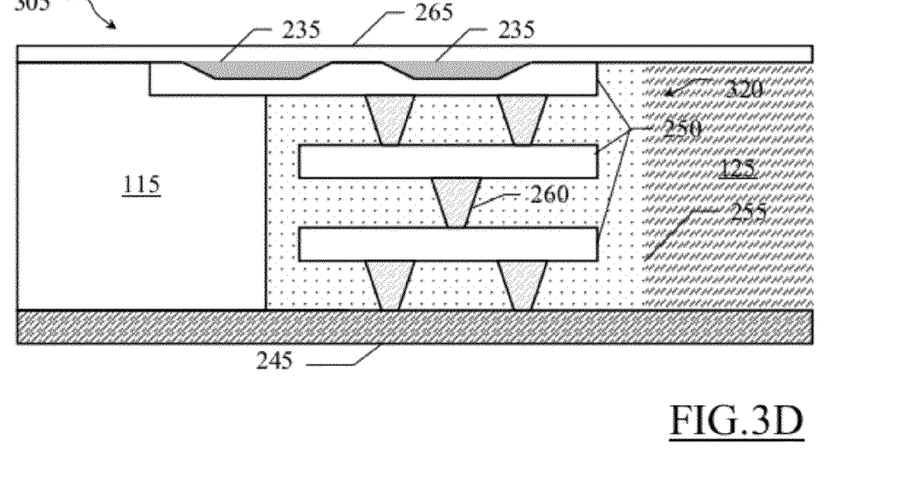

In order to implement the chip 305 according to the just described embodiment, the production process is very similar to that previously disclosed, with the difference that the making of the seal ring 320 provides for the formation of a last metal layer 350 including the metal layer 250 and an extension of the same protruding into the functional region 115 and that implements the additional portion 370 of the seal ring 320 (see FIG. 3B, wherein there is shown in front view the portion of the chip 305 indicated by III in FIG. 3A). From this point the manufacturing process of the chip 305 continues as that of the chip 205 above described, and in particular with the writing of the dots 235 (two, in the example at issue) and missing dots (not visible), and subsequent covering through the passivation layer 265, as shown in FIGS. 3C and 3D, respectively.

It is noted that by combining the two just-described embodiments, it may be possible to obtain a variety of possible implementations; for example, the extension 370 may be made on different metal layers 250 (not necessarily on the last one). Moreover, in the presence of specific layouts of the chip, it may be possible to make such extension 370 protruding towards the scribe lines 125 (since, after the cutting operation that separates from each other the various chips in the wafer, the chip typically may include a more or less extensive residual portion of the scribe line 125).

Moreover, if the sizes of the seal ring and that of the dots are sufficient, it may be possible to create an encoding system or two-dimensional code without necessarily forming the extension 370. It is noted that, although in the embodiment illustrated in the figure the two-dimensional code is implemented as two strings of dots and missing dots, actually it may be achieved even using more than two strings.

Figure 4A:
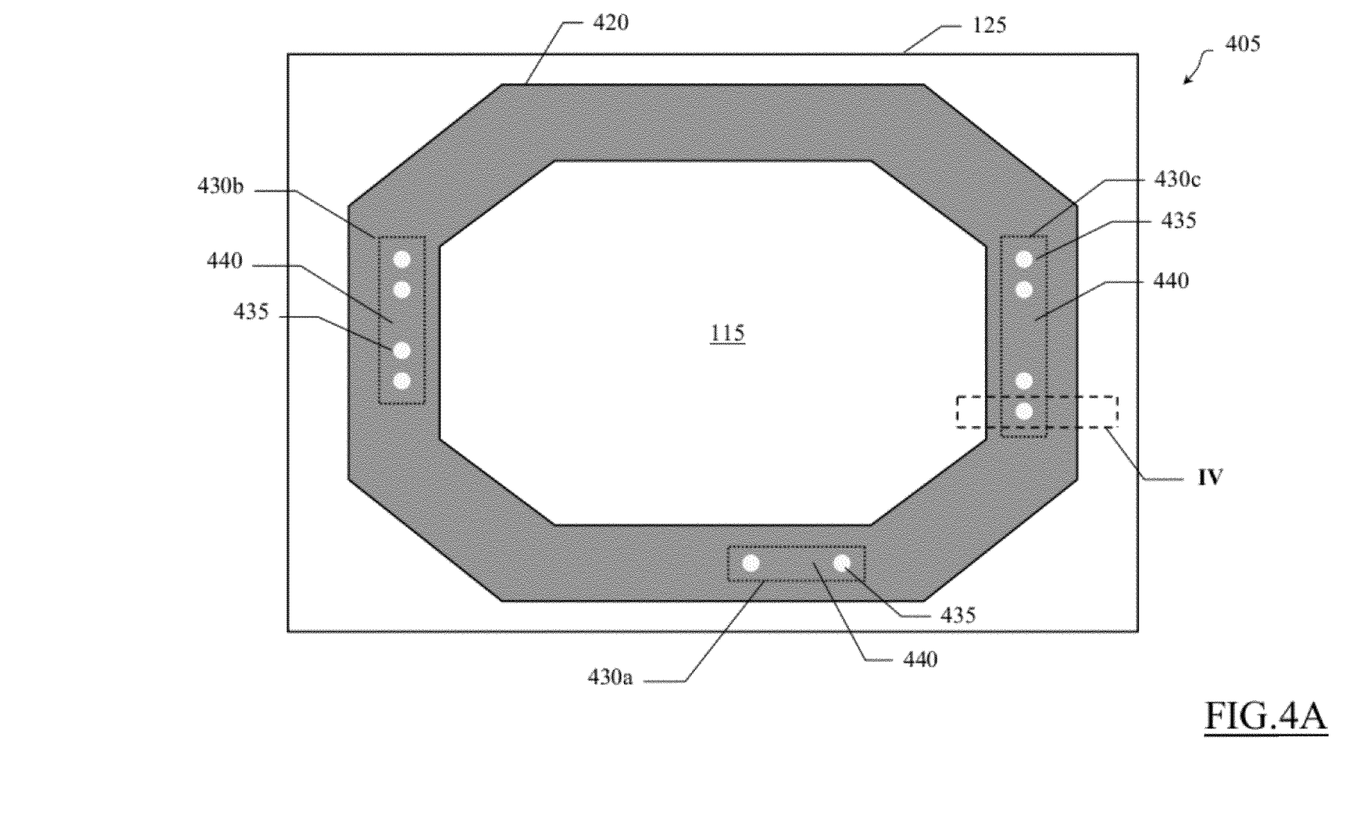
FIG. 4A shows in top view a generic chip of the structure of FIG. 1 according to a further embodiment.

Turning to FIG. 4A, it shows in top view a generic chip 405 according to an embodiment. The chip 405 is substantially similar to the chip 205, but, unlike the latter, it has a seal ring 420 configured in such a way that the dots 435 and the missing dots 440 have such a color contrast to make them distinguishable in a particularly easy and clear way during the reading operation of the codes of the respective markers 430a, 430b, 430c.

Figure 4B:
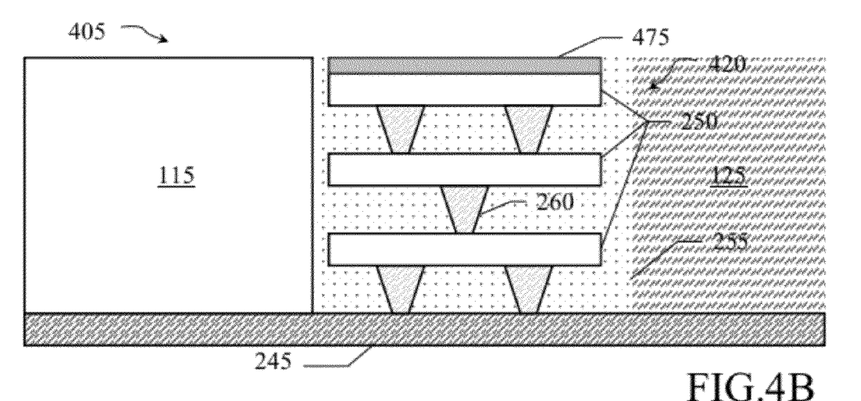
FIGS. 4B-4D schematically show in front view some steps of a production process of the chip of FIG. 4A according to an embodiment.

As in the foregoing, in order to illustrate the main steps of an embodiment of a production process of the chip 405, there is shown in front view a significant portion of the latter (delimited by IV in FIG. 4A); with particular reference to FIG. 4B, on the last metal layer 250, for example of copper, a coating conductive layer 475 (e.g., of aluminium) is deposited, for example, with a thickness lower with respect to the conductive layer 250 below. In such configuration, the corresponding dots 435 and missing dots 440 may be formed by exploiting the color difference between the copper (typically reddish, but white painted for simplicity) and the aluminium (typically silver) of which the metal layers 250 and the coating conductive layer 475 are formed, respectively. In particular, in this case a dot 435 may be obtained by incising (e.g., again through laser techniques) only the coating conductive layer 475 and leaving intact the metal layer 250 below it (as visible in FIG. 4C), whereas a missing dot 440 (not visible) is correspondingly associated with a missed incision of the coating conductive layer 465.

Figure 4C:
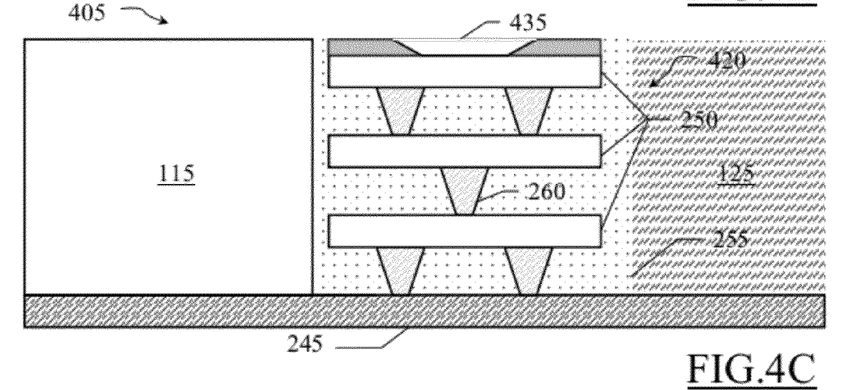

Therefore, unlike the previously described embodiments, the dot 435 may be better distinguished (from the missing dot 440) thanks to the color difference between the copper (of the last metal layer 250) uncovered by the incision and the aluminium (of the residual coating conductive layer 475 around it). Moreover, the marking operation or code writing may have a briefer duration, since the incision of the coating conductive layer 475, having to be performed for a lower depth, needs a lower time; such implementation, moreover, is also remarkably versatile, since the aluminium coating conductive layer 475, having a reduced thickness, may be effectively drilled also using a mechanical tool; for example, by pressure using a suitable probe (e.g., of the cantilever type), it may be possible to leave a probe mark functionally equivalent to the groove to which the dot is associated.

Figure 4D:
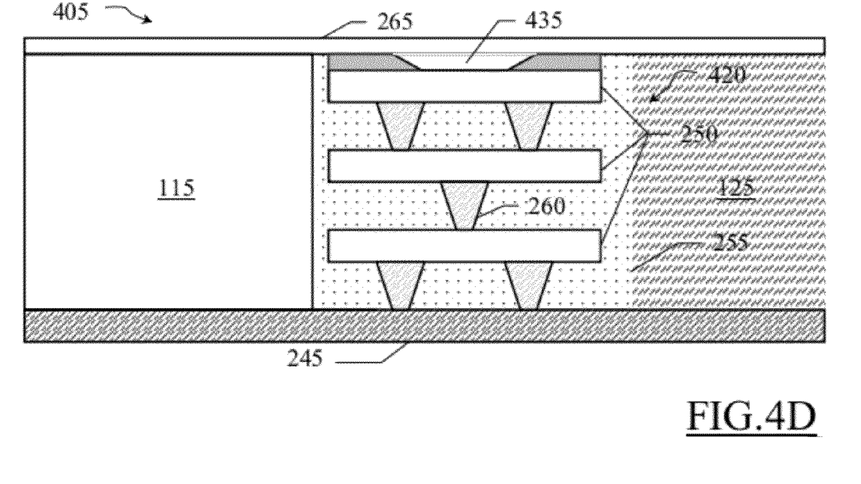

The process then continues in FIG. 4D, with the deposition of the passivation layer 265, in a quite similar manner as previously described.

In a variant not shown, having in this example used aluminium for the coating conductive layer 475 on the copper metal layer 250, the passivation layer 265 may be possibly opened at least in a portion of the seal ring 420 (in a quite similar manner to how is done for an interconnection terminal or pad of the chip 405), and therefore the marking operation may occur also after the deposition of the passivation layer 265. This may be useful for adding further information during the production process. In a further variant not shown, the coating layer 475, rather than being of a conductive material, may be formed by using materials with such features that they are able to store information; for example, it may be possible to use chalcogenide alloys or heat-sensitive or photosensitive materials, which may vary one of their characteristics (e.g., their status or color or other chemical and physical properties) locally in response to a given procedure (e.g., a thermal and/or optical one). Since the passivation layer 265 is typically transparent, the marking operation may also occur after the deposition of the passivation layer 265 itself, depending on the material used and on the characteristic subjected to variation.

As outlined in the foregoing, also such embodiment may be combined, even partially, with those previously described, also jointly with conventional techniques, so as to obtain a large variety of implementations based on a principle of exploiting the seal ring as an element on which to make the markings, for example, in the form of binary code.

Figure 5:
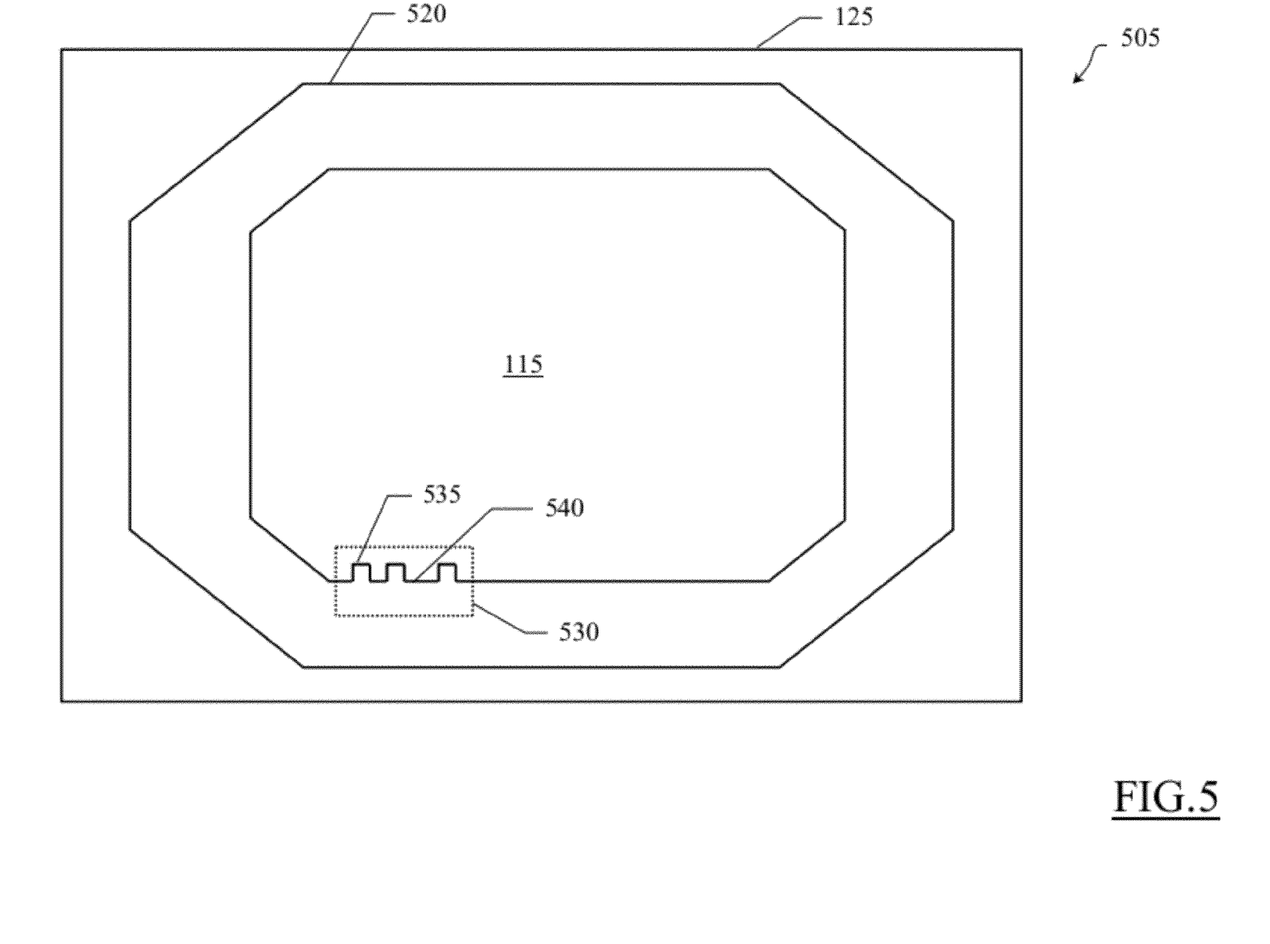
FIG. 5 shows in top view a generic chip of the structure of FIG. 1 according to a still further embodiment.

A different approach for making the markings by exploiting the seal ring is shown in FIG. 5; in particular, such figure shows in top view a generic chip 505 according to an embodiment. The chip 505 has a seal ring 520 structurally equivalent to the seal ring 120, but, unlike the latter, it has at least one conductive layer (for example, the last one) visible in reading with a cantilevered structure having a shaped side profile according to the information to be encoded. Such shaped profile identifies a marker 530 including bumps 535 and missing bumps 540 (functionally analogous to the dots and missing dots previously described), which may be read, for example, as a binary digit 1 and binary digit 0 (in the example at issue, the marker 530 encodes a binary string of value 101001). It is noted that such marker 530 is defined lithographically (i.e., it is obtained by a proper photolithographic mask that allows directly making the conductive layer with the shaped profile), and obtained by means of, and during, the normal photolithographic process by which the chips 505 are made within the wafers; therefore, such marker 530 is typically able to encode only fixed information (i.e., according to the corresponding mask used), and therefore it is advantageously usable as a marker for encoding auxiliary information that are usually shared by each chip of a same wafer 110 (such as for example details about the masks set used and the like), or in combination with other encoding systems for facilitating the reading thereof. Therefore, such embodiment may be particularly suitable for use in combination with, for example, the embodiments described above (or possibly in combination with conventional techniques), so as to obtain markers with encoding systems being advanced, complete and readily identifiable and readable, and at the same time involving a reduced area occupation.

Moreover, it is noted that the shape of the bumps 535 and missing bumps 540 is not limitative, as they may be, for example, rectangular (as in the exemplary embodiment shown in the figure), triangular, semicircular, polygonal, any combination thereof, or any other shape.

Finally, it is noted that, similarly to that previously described, the chip 505, and hence the marker 530, is covered by the passivation layer 260 (not shown in the figure) for preserving it from external contaminations.

Naturally, in order to satisfy local and specific requirements, one may apply to one or more of the above-described embodiments many logical and/or physical modifications and alterations. More specifically, although one or more embodiments have been described with a certain degree of particularity, it is understood that various omissions, substitutions and changes in the form and details as well as other embodiments may be possible. In particular, different embodiments may even be practiced without the specific details (such as the numeric examples) set forth in the preceding description for providing a more thorough understanding thereof; on the contrary, well known features may have been omitted or simplified in order not to obscure the description with unnecessary particulars. Moreover, it is expressly intended that specific elements and/or method steps described in connection with any disclosed embodiment may be incorporated in any other embodiment as a matter of general design choice.

Moreover, an embodiment lends itself to be implemented with an embodiment of a method (by using similar steps, removing some steps being not essential, or adding further optional steps); the steps may be performed in different order, concurrently or in an interleaved way (at least partly).

The type of marker is not limitative; in particular, an embodiment of the marker may be implemented by alphanumeric codes (i.e., by letters and numbers), possibly in combination with binary codes. Moreover, for manufacturing reasons, different portions of the same seal ring may have corresponding markers implemented by encoding systems different from each other.

Different seal rings, even with different heights, may be provided around each functional region; in such condition, an embodiment may be applied in a similar manner on one or more of such seal rings. The seal ring may have any shape and size. In addition, the seal ring may be provided with sacrificial structures (for example, for reinforcing the chip corners), which, although being intended with good probability to be lost during the cutting operation of the wafer, may in any case be provided with markings analogous or similar to those previously described.

In addition, the protruding extension or additional portion may be formed on more than one metal layer, and such extensions may be staggered between each other (e.g., extending alternately towards the functional region and towards the scribe lines) so as to be all visible during the reading of the markings. Analogous considerations apply of course also for the cantilevered structure.

Nothing prevents the coating conductive layer from including a multi-layer structure, in order to obtain suitable color and hardness characteristics for distinguishing the dots from the missing dots and performing the incision according to desired modes and times. In this respect, it is noted that the last metal layer (as well as at least part of those below it) may be made of aluminium, whereas the coating conductive layer may be made of copper.

Furthermore, the formation of a dot by pressure of a suitable probe may also be performed in an embodiment that does not provide for the formation of the coating layer on the last metal layer; in this respect, the last metal layer, or the one that defines the readable portion to be marked, may be formed with a thickness thin enough to ensure the erosion thereof in the event of even relatively slight pressure by the probe or other mechanical means.

Moreover, the shape of the dots is not limitative and it is also possible to use dots having different shapes on the same seal ring for example for implementing a proper code. It may be useful, for example, to use a dot having an elongated shape to be more visible even in case that wire bonds are provided. Anyway, by using particular focusing optical techniques, the dots may be visible even in the presence of wire bonds; for this reason, embodiments are not limited to regions of the seal ring not covered by wire bonds.

Similar considerations apply if the chip has a different structure or includes equivalent elements; in addition, the elements may be separated from each other or combined together, in whole or in part. For example, each element of the integrated circuit may have any shape and/or size, and may be made of any other material.

It is understood that the proposed structure may be part of the design of an integrated circuit. The design may also be created in a programming language; moreover, if the designer does not manufacture the integrated circuits or the masks, the design may be transmitted by physical means to others. In any case, the resulting integrated circuit may be distributed by its manufacturer in raw wafer form, as a bare die, or in packages. Moreover, the proposed structure may be integrated with or coupled to other circuits on the same die or in the same chip, or it may be mounted in intermediate products (such as mother boards) and may be, e.g., a controller such as a processor, or may be coupled with one or more other chips (e.g., a controller such as a processor). In any case, the integrated circuit may be suitable to be used in complex systems (such as automotive applications or microcontrollers).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An integrated circuit, comprising:
   a surface area delimited by edges;
   a functional region for implementing specific functionalities of the integrated circuit;
   at least one seal ring spaced apart from the edges and disposed around the functional region, wherein the at least one seal ring comprises a metal layer having a thickness, an inner perimeter edge, and an outer perimeter edge; and
   at least one marker indicative of information of the integrated circuit, wherein said at least one marker comprises at least one removed portion in a top surface of said metal layer of the respective seal ring, the at least one marker visible from outside of the integrated circuit, the at least one removed portion forming a groove having a depth that is less than said thickness, and the groove is positioned in between and away from the inner perimeter edge and the outer perimeter edge.

2. The integrated circuit of claim 1, wherein the at least one removed portion defines a round indentation.

3. The integrated circuit of claim 2, wherein the round indentation is covered with paint and sealed with a passivation layer.

4. An integrated circuit die, comprising: a surface area delimited by edges;
   a peripheral structure spaced apart from the edges, wherein the peripheral structure is bounded by an outer perimeter edge and an inner perimeter edge, the peripheral structure comprising a metal layer having a thickness; and
   a mark disposed in a top portion of the metal layer of the peripheral structure in between and separate from the outer and inner perimeter edges, said mark having a depth less than said thickness and representing information about the integrated circuit die.

5. The integrated circuit die of claim 4 wherein the peripheral structure is a seal ring.

6. The integrated circuit die of claim 4 wherein the mark is a groove forming an indentation into the top surface of the metal layer.

7. The integrated circuit die of claim 6 wherein the mark includes paint disposed in the indentation in the top surface of the metal layer.

8. The integrated circuit die of claim 4 wherein the mark includes an unaltered portion of the top surface of the metal layer.

9. The integrated circuit die of claim 4 further comprising a protrusion of the inner perimeter edge of the peripheral structure.

10. The integrated circuit die of claim 9 wherein the protrusion has a top surface parallel to the top surface of the peripheral structure.

11. The integrated circuit die of claim 10, wherein the protrusion has a surface perpendicular to the top surface of the peripheral structure.

12. The integrated circuit die of claim 4, wherein the mark represents unique information about the integrated circuit die with respect to any other die.

13. An integrated circuit, comprising:
    a die delimited by edges,
    a peripheral structure spaced apart from the edges and having a surface in a peripheral area of the die, wherein the peripheral structure is bounded by an outer perimeter edge and an inner perimeter edge and comprises a metal layer having a thickness; and
    a mark disposed in a top portion of the metal layer of the peripheral structure in between and away from the outer and inner perimeter edges, said mark representing information about the die, and said mark having a depth less than said thickness of the metal layer.

14. The integrated circuit of claim 13, wherein the peripheral structure is a seal ring surrounding a functional region.

15. A system, comprising:
    a die delimited by edges, the die including:
    a peripheral seal ring structure spaced apart from the edges and having a top surface, wherein the peripheral seal ring structure is bounded by an outer perimeter edge and an inner perimeter edge and comprises a plurality of separate metal layers; and
    a mark disposed in a top portion of a top metal layer of the plurality of separate metal layers of the peripheral seal ring structure, not protruding through the top metal layer, and in between and away from the outer and inner perimeter edges and representing information about the die.

16. The system of claim 15 wherein the mark comprises a pattern identifying a location of the die in a wafer.

17. The system of claim 15, wherein the mark represents information about the die with respect to any other die.

* * * * *